United States Patent [19]

Montier

[11] 4,356,055
[45] Oct. 26, 1982

[54] PROCESS AND DEVICE FOR MONITORING THE PLASMA ETCHING OF THIN LAYER UTILIZING PRESSURE CHANGES IN THE PLASMA

[75] Inventor: Michel Montier, Grenoble, France

[73] Assignee: Societe pour L'Etude et la Fabrication de Circuits Integres Speciaux EFCIS, Grenoble, France

[21] Appl. No.: 285,332

[22] Filed: Jul. 22, 1981

[30] Foreign Application Priority Data

Jul. 24, 1980 [FR] France ................ 80 16329

[51] Int. Cl.$^3$ .......................................... H01L 21/306
[52] U.S. Cl. ........................ 156/626; 73/37; 73/717; 156/643; 156/345; 204/192 E
[58] Field of Search ............ 156/626, 627, 643, 345; 204/192 E; 73/37.5, 717, 37

[56] References Cited

U.S. PATENT DOCUMENTS 4,263,088 4/1981 Gorin ........................ 156/626

OTHER PUBLICATIONS

Hitchman et al, "A Simple . . . Etching" J. of Vacuum Science Techno., vol. 17, No. 6 (11/80) pp. 1378-1381.
Poulsen, "Plasma Etching . . . A Review" J. of Vacuum Science Techno., vol. 14, No. 1 (1/77) pp. 266-274.
Raby, "Mass . . . Etching" J. of Vacuum Science Techno., vol. 15, No. 2 (3/78) pp. 205-208.

Primary Examiner—Jerome W. Massie
Attorney, Agent, or Firm—Cushman, Darby & Cushman

[57] ABSTRACT

A process and device for plasma etching a thin layer. The process includes the steps of identifying a plateau in gas pressure that occurs slightly before the end of etching and then detecting a pressure variation (increase or decrease) from the plateau pressure. Etching is stopped at a predetermined time interval after the variation following the plateau begins. The device includes one or more pressure sensors and means for determining the plateau and subsequent pressure variation.

3 Claims, 2 Drawing Figures

PROCESS AND DEVICE FOR MONITORING THE PLASMA ETCHING OF THIN LAYER UTILIZING PRESSURE CHANGES IN THE PLASMA

BACKGROUND OF THE INVENTION

The present invention relates to a process and device for plasma etching a thin layer and more particularly a process and device for detecting the end of such etching.

The present invention applies more particularly to the manufacture of discrete or integrated semiconductor devices having deposited, or successively grown, on a substrate multiple thin layers which are etched to desired configurations. This etching of a thin layer resting on a solid substrate or on another layer is generally carried out through a mask of desired configuration by chemical or plasma etching.

In the case of utilizing plasma etching, we shall be more particularly concerned here with the problem of detecting the end of etching. In fact, it is important to be able to accurately stop the etching at the interface between the thin layer and the substrate. This is made difficult in practice because:

the etching is not perfectly homogeneous on a given sample and between several samples, that is to say that some regions are bared before others and that the interface between the thin layer and the underlying layer is progressively reached from one region to the next;

the etching selectivity between the etching speed of the thin layer which it is desired to etch and of the underlying layer or substrate is fairly low; generally, the ratio between these speeds varies between one and ten depending on the case.

Thus, if the etching is too short, there is a risk of undesired parts of the thin layer being maintained, but if the etching is too long, there is a risk, on the one hand, of etching the underlying layer and, on the other hand, of creating over-etching of ill-defined value under the masking layers.

To attempt to resolve this problem of determining the end of etching of a thin layer, several processes have been proposed in the prior art.

One of these known processes includes carrying out a measurement by spectrophotometry: the appearance or the disappearance of a spectral line is detected which is characteristic of the discharge spectrum of the plasma during etching of a layer of given nature. Nevertheless, this process is awkward to use and presents a not inconsiderable response time which does not allow the end of etching to be accurately selected.

Another process includes carrying out measurements by mass spectrometry: the characteristic ions or molecules of the plasma are detected during etching. This process is also awkward to use and presents a long response time.

Yet another process includes proceeding by reflectometry or optical ellipsometry: this process includes directing a light beam towards the thin layer during etching and measuring the variation of the thickness thereof during the time. This pinpoint process is, on the one hand, relatively delicate to use and, on the other hand, does not take into account the lack of homogeneity of the etching and assumes that the substrates are fixed.

SUMMARY OF THE INVENTION

Thus, one object of the present invention is to provide a novel process and device for detecting the end of plasma etching of a thin layer. The process and device provide rapid detection of the end of etching, are simple to implement and are inexpensive.

To attain these objects as well as others, the present invention provides a process for the plasma etching of a thin layer deposited on a substrate of distinct physical or chemical nature comprising the steps of measuring the pressure in the enclosure in which the etching occurs and in stopping this etching after the pressure in the enclosure has leveled off then has deviated from the value of such leveling off, or plateau.

A device in accordance with the present invention implementing this process comprises a pressure sensor in the enclosure in which the etching occurs, means for detecting the variations in this pressure, means for supplying a control signal adapted to cause stopping of the etching operation once the pressure has reached a plateau and shortly after it has deviated from this plateau.

It will be noted that a pressure detector forms a particularly simple sensor compared with the sensors of the type used in the prior art such as spectrophotometers, spectrometers, or optical reflectometry assemblies.

DESCRIPTION OF THE DRAWINGS

These objects, characteristics and advantages as well as others of the present invention will be set forth in greater detail in the following description of particular embodiments made with reference to the accompanying figures in which.

DESCRIPTION OF THE PREFERRED EMBODIMENT

Figure 1:
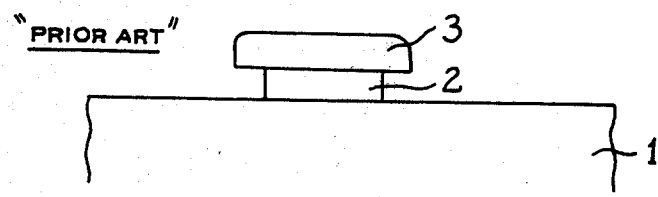
FIG. 1 shows a structure formed by plasma etching.

FIG. 1 shows a substrate 1 on which has been formed a zone of a thin layer 2 under a masking layer 3. Substrate 1 is for example a silicon substrate covered with a silica layer (not shown), the thin layer 2 is for example a polycrystalline silicon layer and mask 3 is for example a resin mask.

With conventional plasma etching processes, the end of etching is not specifically detected and the etching is continued for an average period of time resulting from acquired experience. The result is etching dispersions due to slight variations in the etching conditions or in the nature of the layers. Among the drawbacks of this process, it may be more especially mentioned that the zone of lateral over-etching of layer 2 under mask 3 is very variable, for example in practice a dispersion of the order 0.5 to 1.5 times the thickness of the etched layer is found. Such a dispersion is relatively large in relative value whereas the dimension of the elementary pattern of layer 2 which it is desired to maintain may be of the order of a micron.

The present invention follows from a detailed analysis of the pressure variation process in the plasma etching enclosure during etching.

Figure 2:
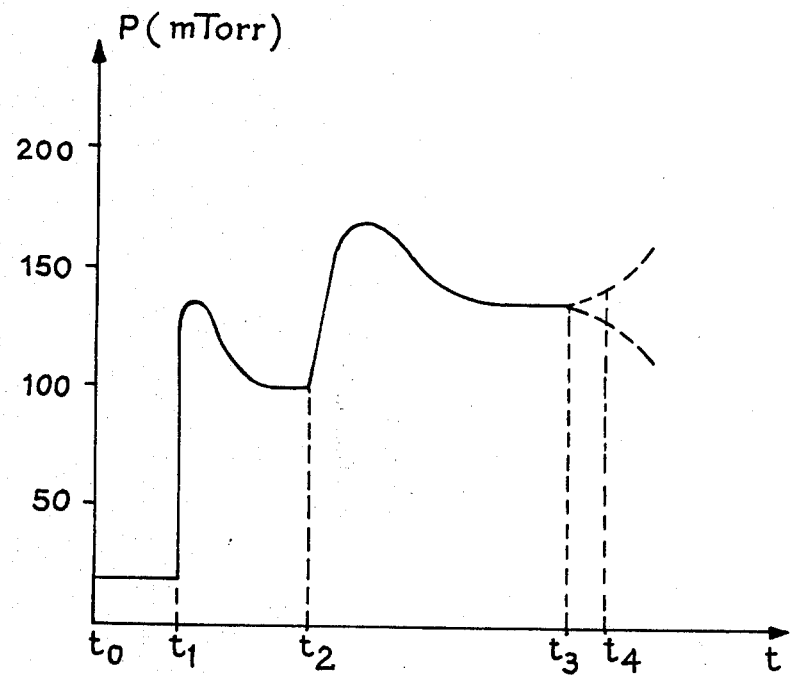
FIG. 2 shows pressure variations in a plasma etching enclosure.

FIG. 2 illustrates by way of example the trend of the pressure variations. Pressures have been shown as ordinates, in millitorr, but are merely representative and will depend in practice on the particular conditions chosen for the etching, on the layer to be etched and on the gas present in the enclosure. In a first step between times $t_0$ and $t_1$, the enclosure is evacuated. Then, in a second step between times $t_1$ and $t_2$, the etching gas, for example a mixture of $SF_6$ and $O_2$ or $CF_4$ is introduced into the enclosure. At time $t_2$, the pressure disturbances resulting from the introduction of the gas are stabilized and the pressure has reached a plateau. Then, a discharge is produced in the gas and the etching takes place between times $t_2$ and $t_3$. In a first step, the pressure rises relatively rapidly then diminishes to reach a plateau.

The experimental findings on which the present invention is based result from the discovery that, once the thin layer to be etched (layer 2 in the case of FIG. 1) has been eliminated and the etching begins to effect the underlying substrate, there occurs a variation of the pressure in the enclosure. This variation may be in the direction of a pressure increase or decrease. For example, a pressure increase will occur in the case of a layer of polycrystalline silicon on silica and a pressure decrease in the case of a polycrystalline silicon layer on corindon.

With time $t_3$ detected, from which this pressure variation occurs, etching is continued for the period $t_3$ to $t_4$ so as to ensure, on the one hand, that the thin layer to be eliminated is completely eliminated even in the places where the etching might have been slower and, on the other hand, that the lateral over-etching under the mask is constant in dimension.

The increase in accuracy with respect to the value of the over-etching obtained by the present invention may be readily understood. In fact, in the prior art, in the absence of a detection device, the period between times $t_2$ and $t_4$ was roughly estimated and attempts were made to make it constant from one etching to the next even when the conditions might vary during plasma etching. On the other hand, according to the present invention, time $t_3$ is measured and the period between times $t_3$ and $t_4$ is made constant. So the random variations which may occur in the etching time between times $t_2$ and $t_3$ are overcome.

By way of order of size, it may be noted that in some practical cases, for a polycrystalline silicon layer of a thickness of the order of a micron, the etching time may be of the order of a few minutes, for example two to three minutes whereas the extension of etching time between times $t_3$ and $t_4$ will be of the order of a few tens of seconds, for example 10 to 30 seconds.

Conventional devices for measuring and detecting the variations of a pressure may easily be used by a man skilled in the art for implementing the present invention. There will be used for example, at the output of a pressure sensor disposed in the enclosure, an instantaneous pressure detector and a detector of the average pressure over a relatively short period of time. The instantaneous pressure will be compared with the average pressure. Thus the presence of the pressure plateau may be detected before time $t_3$ then this time $t_3$ determined by determining the difference between the average value and the instantaneous value. Of course, other conventional processes for measuring and detecting pressure variations may be used.

The present invention is not limited to the embodiments and specific applications which have been described above. It covers on the contrary the variations and generalizations included in the field of the claims hereafter.

What is claimed is:

1. A process for the plasma etching of a thin layer deposited on a substrate comprising the following steps:
    starting the etching, of the thin layer
    measuring the pressure in an enclosure in which the etching occurs, and
    stopping the etching after the pressure has reached a plateau then has deviated from a value corresponding to this plateau.

2. A device for the plasma etching of a thin layer deposited on a substrate, comprising:
    means for measuring the pressure in the enclosure in which the etching takes place;
    means for detecting variations in this pressure;
    means responsive to said variation detecting means for supplying a control signal to stop the etching operation after the pressure has reached a plateau and shortly after it has deviated from this plateau.

3. The device as claimed in claim 2, wherein said pressure variation detection means comprise:
    a detector of the average value of the pressure,
    a detector of the instantaneous value of the pressure, and
    means for comparing outputs of said average value and instantaneous value detectors and generating said control signal.

* * * * *